US007537659B2

United States Patent
Triboulet et al.

(10) Patent No.: US 7,537,659 B2
(45) Date of Patent: May 26, 2009

(54) METHOD OF OBTAINING A CDTE OR CDZNTE SINGLE CRYSTAL AND THE SINGLE CRYSTAL THUS OBTAINED

(76) Inventors: Robert Georges Lucien Triboulet, 24, allee de la Sacletterie, Gif sur Yvette (FR) F-91190; Said Assoumani Said Hassani, 4 ter, rue Alfred Dreyfus, St Cyr l'Ecole (FR) F-78210

( * ) Notice: Subject to any disclaimer, the term of this patent is extended or adjusted under 35 U.S.C. 154(b) by 185 days.

(21) Appl. No.: 10/486,177

(22) PCT Filed: Aug. 6, 2002

(86) PCT No.: PCT/FR02/02816

§ 371 (c)(1),
(2), (4) Date: Dec. 10, 2004

(87) PCT Pub. No.: WO03/014428

PCT Pub. Date: Feb. 20, 2003

(65) Prior Publication Data

US 2005/0115489 A1 Jun. 2, 2005

(30) Foreign Application Priority Data

Aug. 6, 2001 (FR) .................................. 01 10512

(51) Int. Cl.
*C30B 28/06* (2006.01)
*C30B 29/48* (2006.01)
*C30B 29/50* (2006.01)

(52) U.S. Cl. ................. 117/89; 117/6; 117/71; 117/100; 117/109; 117/216; 117/957; 117/958

(58) Field of Classification Search ................. 117/957, 117/958, 216, 109, 100, 89, 71, 6
See application file for complete search history.

(56) References Cited

U.S. PATENT DOCUMENTS

| 4,207,119 | A | * | 6/1980 | Tyan | 136/258 |
|---|---|---|---|---|---|
| 4,662,980 | A | * | 5/1987 | Triboulet et al. | 117/42 |
| 4,765,863 | A | * | 8/1988 | Durand et al. | 117/42 |
| 4,923,561 | A | * | 5/1990 | Chemans et al. | 117/83 |
| 5,028,296 | A | * | 7/1991 | Tregilgas | 438/796 |
| 5,304,499 | A | * | 4/1994 | Bonnet et al. | 438/94 |
| 6,251,701 | B1 | * | 6/2001 | McCandless | 438/95 |
| 6,673,647 | B2 | * | 1/2004 | Pelliciari | 438/95 |
| 2002/0192929 | A1 | * | 12/2002 | Pelliciari | 438/478 |

(Continued)

FOREIGN PATENT DOCUMENTS

EP 1013801 A1 6/2000

OTHER PUBLICATIONS

Nagayoshi et al, "Growth of Thick CdTe Films by Close-Space-Sublimation Technique", IEEE, pp. 4411-4414.*

(Continued)

*Primary Examiner*—Robert M Kunemund
*Assistant Examiner*—G. Nagesh Rao
(74) *Attorney, Agent, or Firm*—Jacobson Holman PLLC

(57) ABSTRACT

The invention relates to the field of CdTe or CdZnTe single crystal production and to an improved solid-phase method of obtaining large CdTe or CdZnTe crystals having an excellent crystalline structure.

9 Claims, 2 Drawing Sheets

U.S. PATENT DOCUMENTS

| | | | |
|---|---|---|---|
| 2004/0000266 A1* | 1/2004 | D'Evelyn et al. | 117/2 |
| 2005/0160979 A1* | 7/2005 | Grin et al. | 118/666 |
| 2006/0207497 A1* | 9/2006 | D'Evelyn et al. | 117/71 |
| 2007/0036700 A1* | 2/2007 | Redden et al. | 423/99 |

OTHER PUBLICATIONS

Triboulet, R. "Solid State Recrystallization: A Promising Technique for the Growth of Semiconductor Materials", 2003, Wiley Pubs, Crystal Res. Technol. 38, No. 3-5, pp. 215-224.*

Triboulet, R. "CdTe and CdZnTe Growth"-Crystal Growth Technology, Chapter 17, Wiley and Sons Pubs, pp. 373-406.*

Mokri et al., "Growth of large, high purity, low cost uniform CdZnTe crystals by the . . .", Journal of Crystal Growth, vol. 138, Apr. 2, 1994, pp. 168-174.

Zappettini et al., "A new process for synthesizing high-purity stoichiometric cadmium telluride", Journal of Crystal Growth, vol. 214/215, Jun. 2000, pp. 14-18.

Zhu et al., "Modified growth of Cd1-xZnxTe single crystals", Journal of Crystal Growth, vol. 208, Jan. 2000, pp. 264-268.

Melnikov et al., "Growth of CdZnTe single crystals for radiation detectors", Journal of Crystal Growth, vol. 197, Feb. 15, 1999, pp. 666-669.

Brunet et al., "Horizontal Bridman growth of large high Cd1-yZnyTe crystals", Materials Science and Eng., vol. B16, 1993, pp. 44-47.

"Seed-free growth of (111) oriented CdTe and CdZnTe crystals by solid-state recrystallization," *Journal of Crystal Growth*, 249 (2003) 121-127.

* cited by examiner

METHOD OF OBTAINING A CDTE OR CDZNTE SINGLE CRYSTAL AND THE SINGLE CRYSTAL THUS OBTAINED

The present invention pertains to the obtaining of single crystals of CdTe or CdZnTe. It relates to an improved method for obtaining large-size CdZnTe or CdTe crystals having excellent crystalline structure.

Cadmium telluride or CdTe can be considered as the major representative of the type II-VI semiconductor family.

Over approximately the last forty years, CdTe has aroused considerable interest and has found numerous industrial applications. It has given rise to several international conferences, and its history was given in the monograph by K. Zanio (Semiconductors and Semimetals, Vol.13, Cadmium Telluride, Academic Press 1978). CdTE has a unique set of properties making it highly suitable for numerous applications. Its forbidden bandwidth of 1.5 eV, right in the centre of the solar spectrum, makes it an ideal material for photovoltaic conversion, and numerous companies market CdTe-based solar cells. Its high average atomic number of 50, its wide forbidden bandwidth and its good electric transport properties are adapted to nuclear detection. Its high electro-optical coefficient combined with its low absorption coefficient are used for the production of high-performance electro-optical modulators and photorefractive devices. CdTe has two types of conductivity, n and p, enabling its use for the production of field-effect diodes and transistors. Semi-magnetic conductors, such as CdMnTe, also offer advantageous properties such as gigantic Faraday rotations making them very attractive for optic insulators.

CdTe is also used at industrial level in the form of its ternary alloy CdHgTe, one of the major materials for infrared detection, and CdZnTe, which is used as substrate for epitaxial depositing of HgCdTe layers, and as nuclear detector, this latter application being of particular interest especially for medical use.

Two applications currently dominate the industrial development of CdTe:
  CdTe and more particularly its alloy with 4% zinc, is very widely used as substrate for epitaxial depositing of HgCdTe layers, a leading material in the area of infrared detection, especially in the two bands of wavelength 3-5 µm and 8-12 µm. Several industrial companies produce and market substrates of $Cd_{0.96}Zn_{0.04}Te$ and the tendency is towards the fabrication of substrates of increasing size for the subsequent fabrication of focal plane arrays for very large-size IR detectors.
  the binary compound CdTe, and its alloy CdZnTe with low concentrations of zinc, is currently the subject of intensive research in the area of nuclear detection for which it offers an enormous potential, especially in medical applications, both for X-ray detection with medical radiography applications, and in gamma detection with medical gammagraphy applications (gamma camera). The much superior detection rapidity of the CdTe semiconductor compared with current scintillation detectors allows for real time imaging, highly advantageous for the observation of body parts in movement such as the heart. Also, CdTe detection is conducted at ambient temperature and not at the temperature of liquid nitrogen as for scintillation detectors, hence lower operating costs and a very substantial lower investment in equipment, and the possibility of producing mobile equipment.

Both epitaxial substrate applications and applications relating to nuclear detection necessarily involve the use of single crystals, very difficult to prepare up until now. The difficulty in producing single crystals is currently holding back the development of these applications. This is why considerable efforts have been devoted over the last forty years to preparing CdTe single crystals.

Growth techniques for CdTe single crystals can be briefly recalled. They are divided into several categories:
  growth from a liquid, whether stoichiometric or non-stoichiometric, whose limits are detailed further on;
  vapour phase growth, either by sublimation or by chemical transport. These techniques in which the ionicity of the CdTe bond also has a very negative influence, are limited by the uncertainty of obtaining single crystals and by very slow growth rates, unfit for industrial growth.

Given its melting point of 1092° C., lower than the softening point of silica, liquid phase growth nonetheless remains the most frequently used for CdTe, and it is this technique which is essentially used at industrial level in its vertical, horizontal or pressure Bridgman variants.

The preparation of CdTe single crystals raises numerous technical difficulties of which some are detailed below.

Phenomena of pre- and post-transition are known, below and above the melting point of CdTe, in both liquid and solid states. Pre- and post-transition phenomena are due to the ionic nature of the Cd—Te chemical bond. This ionic nature leads to highly associated CdTe liquids in the vicinity of the melting point, which leads to the presence of highly organized particles influencing the nucleation process and growth kinetics.

In the solid state, and again close to the melting point, phase transitions reported by numerous authors also markedly complicate the crystallogenesis of CdTe in liquid phase.

In addition, earth gravity field effects cause convection phenomena which are difficult to control. To overcome this, recourse may be had to microgravity or macrogravity crystal growth techniques for liquid phase and vapour phase methods, whose cost is evidently prohibitive.

In the methods of the state of the art, and in particular in methods using the BRIDGMAN method to obtain CdTe crystals, it was sought to reduce the influence of convection phenomena by growing crystals under microgravity, in particular during journeys into space under conditions of weightlessness, and under macrogravity in centrifuges.

The numerous technical drawbacks cited above in the obtaining of CdTe or CdZnTe single crystals in liquid phase or vapour phase have been resolved by the invention.

It has been shown in the invention that a CdTe or CdZnTe single crystal having excellent single crystalline structure could be obtained using a method conducted in solid phase.

The subject of the invention is a method for obtaining a CdTe or CdZnTe single crystal in which x lies between 0 and 0.2, characterized in that it comprises the following steps:
  a) obtaining a source material of $Cd_{1-x}Zn_xTe$ having a composition close to that corresponding to congruent sublimation, either by crystallizing liquid $Cd_{1-x}Zn_xTe$ using Bridgman's horizontal technique under partial cadmium pressure to adjust stoichiometry, or by annealing a $Cd_{1-x}Zn_xTe$ material pre-synthesized at 800-900° C. in an ampoule with end capillary maintained at ambient temperature.
  b) obtaining a polycrystalline block of $Cd_{1-x}Zn_xTe$ in which x lies between 0 and 0.2 by sublimation of a stoichiometric solid source material of $Cd_{1-x}Zn_xTe$ in a sealed chamber at a temperature of the chamber zone in which the source material is located of between 900° C. and 1000° C., the difference in temperature ΔT between the zone of the source material and the zone of crystal deposit lying between 30° C. and 50° C.

c) obtaining a $Cd_{1-x}Zn_xTe$ single crystal by re-crystallization of the polycrystalline block obtained at step b), by annealing under isothermal conditions under partial Cd pressure lying between $4.10^5$ and $6.10^5$ Pa and at a temperature of between 1000° C. and 1060° C. for a time of between 50 and 200 hours.

Figure 1:
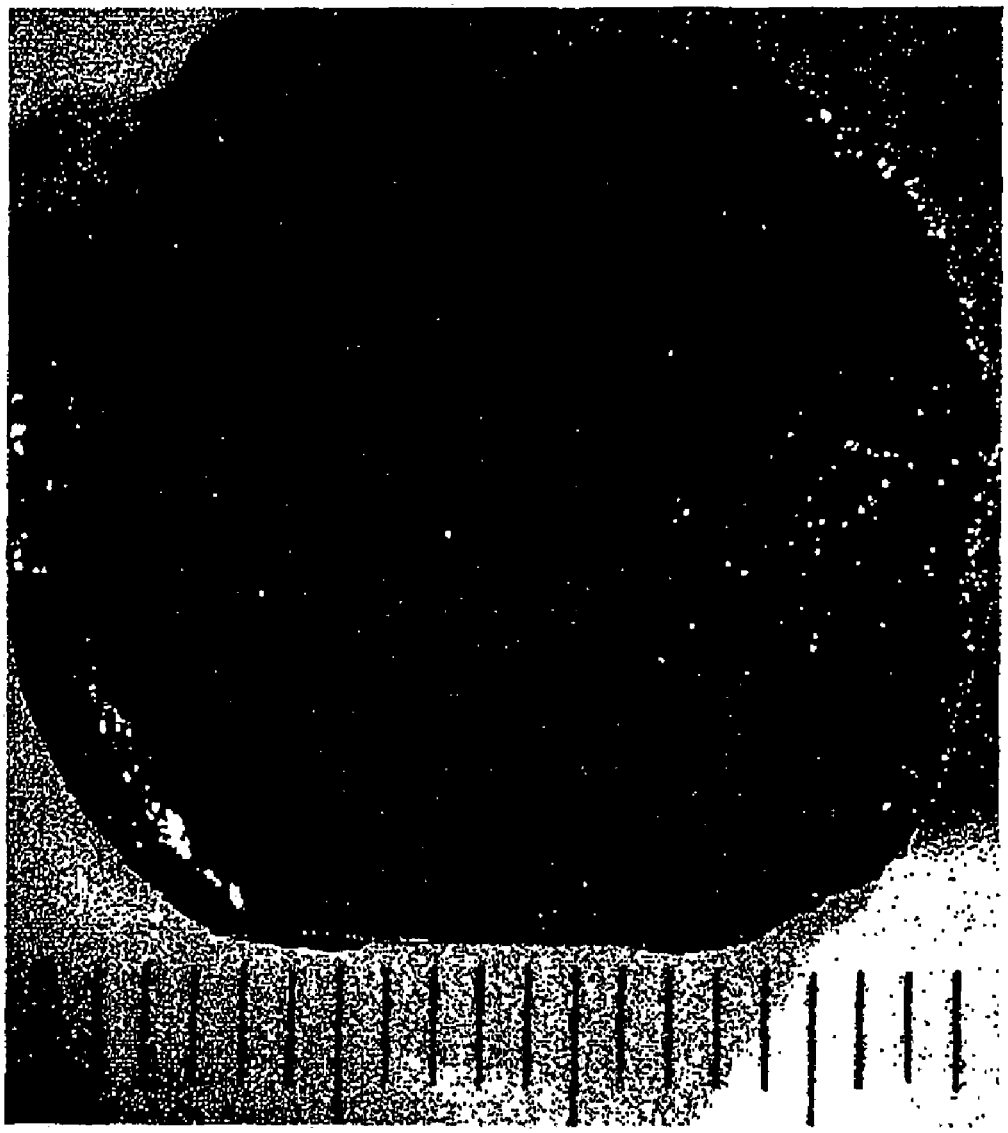
FIG. 1 shows a photograph of a single crystal obtained according to example 1.

The symbols "Cd", "Te" and "Zn" respectively represent the atoms of cadmium, telluride and zinc.

The method for obtaining a $Cd_{1-x}Zn_xTe$ single crystal is conducted at a lower temperature than the melting point of the alloy.

Under these temperature conditions, the phenomena of phase transition are not observed which occur when implementing liquid phase growth methods for crystalline blocks described in the prior art.

In addition, the conditions of the above method enable the growth of practically stoichiometric crystals, unlike conventional methods in which adjustment is more difficult. The source material used for the sublimation step is prepared so that its composition allows congruent sublimation and hence a high transport speed, i.e. with a composition close to stoichiometry.

Another determinant technical advantage of the method of the invention is that this method makes it possible to overcome field effects of earth gravity which cause uncontrolled convection phenomena.

According to a first preferred embodiment of the above method, the value of x in the formula $Cd_{1-x}Zn_xTe$ is equal to zero and the single crystal obtained is a CdTe single crystal.

In a second embodiment of the above method, the value of x in the formula $Cd_{1-x}Zn_xTe$ is different from zero, and the single crystal obtained is a CdZnTe alloy single crystal.

The parameter x advantageously lies between 0.005 and 0.05, preferably between 0.01 and 0.05, and further preferably is 0.04, in particular with a view to obtaining epitaxy substrates for HgCdTe.

Step a) of the Method

This step consists of producing a source material whose composition is close to stoichiometry intended for the second sublimation step. According to the method, this source material is obtained by reaction of Cd and Te elements, and optionally Zn in stoichiometric proportion, then adjustment of stoichiometry either by crystallization of the melt using Bridgman's horizontal method under partial cadmium pressure so as to control stoichiometry difference, or by annealing the synthesized material at a temperature of between 800 and 900° C. in a capillary ampoule in which any excess of one of elements Cd or Te is condensed.

Step b) of the Method

This step consists of forming an ingot of polycrystalline CdTe by sublimation of a source material whose composition is close to stoichiometry. As results directly from the characteristics of the method, a temperature gradient is set up in a sealed chamber, the surface of the source material being maintained at sufficient temperature to cause sublimation of $Cd_{1-x}Zn_xTe$, and the deposit zone being maintained at a lower temperature.

The temperature of the chamber zone in which the source material is located, which lies between 900° C. and 1000° C., was chosen so as to be sufficiently high to promote sublimation from the solid source material while remaining lower than the melting point of CdZnTe.

Advantageously, the temperature of the source material zone lies between 940° C. and 960° C., preferably between 945° C. and 955° C. It is further preferably approximately 950° C.

So as to conduct sublimation under optimum conditions, the difference in temperature $\Delta T$ between the zone of the source material and the zone of crystal deposit is between 30° C. and 50° C.

With a temperature difference $\Delta T$ lower than 30° C., it was observed that the structure obtained tended to be a large-grain structure which is less favourable for the subsequent re-crystallization step. It is recalled that the energy accumulated at the grain joints forms the driving force for re-crystallization. This energy is greater the smaller the grain size and consequently the greater the joint surface.

With a temperature difference $\Delta T$ greater than 50° C., pores and holes were seen to occur in the ingots obtained.

Preferably, the distance between the evaporation surface of the source material and the zone of crystal deposit lies between 10 and 20 cm, and further preferably between 10 and 15 cm.

The optimal conditions for sublimation to form a "polycrystalline" block at step b) of the method are reached through a combination of parameters $\Delta T$ and the distance between the surface of the source material and the deposit zone.

One advantageous parameter of the method according step b) is the thermal interference set up at the growth interface, intended to avoid excessive grain growth during deposit. This thermal interference is achieved by setting up an oscillating temperature schedule in the deposit zone.

Without introducing this thermal interference, the initial crystallites deposited during step b) form nuclei which grow in time to form single crystal structures, which is precisely what it is sought to avoid at this stage of the method. To obtain a polycrystalline ingot or block on completion of step b) of the method, thermal interference is introduced which causes the continual formation of new nuclei over time.

Preferably, a sinusoidal thermal interference is set up which leads to the formation of new nuclei at each temperature oscillation cycle.

Preferably, for a $\Delta T$ value of 30° C., a variation in temperature having a magnitude of 10° C. is set up within the chamber so that value $\Delta T$ varies from 20° C. to 40° C., for example by adequate programming of the heating means. The sinusoidal period may vary, in particular in relation to technical constraints related to the heating means and to the thermal inertia of the source material itself and the duration of step b) to obtain a polycrystalline ingot or block. By way of illustration, a sinusoidal period of between 10 and 30 minutes is preferred, better between 15 and 25 minutes and preferably between 18 and 22 minutes, further preferably of 20 minutes.

In order to perform the method of the invention under optimal conditions, in particular under optimal conditions of thermodynamics and hydrodynamics, use is made of a sealed silica chamber in the shape of a tube preferably having flat ends. At step b) of the method, the geometry of the ampoule is of importance. In particular, the surface of the prepared polycrystalline block determines the surface of the single crystal ingot or block which is the end product of the method. Hence the greater the surface of the polycrystalline block, the greater the surface of the end single crystal ingot or block.

Obtaining a large-size polycrystalline block may advantageously be achieved by using a chamber, an ampoule for example, having a flat end from whose surface the polycrystalline block is formed. With a cylindrical chamber, such as an ampoule, the diameter of the chamber determines the surface of the polycrystalline block formed at step b) and hence also the surface of the end single crystal block.

This geometric characteristic of the chamber used at step b) of the method amounts to an additional difference of the method of the invention compared with known methods in the prior art, in which a chamber with a tapered tip is preferably chosen, so as to promote the formation of a single nucleus, by deposit, from which a single crystal network is to be formed.

According to the invention, at the end of step b), polycrystalline blocks were obtained having a diameter of up to 50.8 mm (up to 2 inches) in diameter.

The duration of step b) is conventionally several hours, until completion of the formation of a polycrystalline ingot or block. It is generally between 5 hours and 48 hours, advantageously between 10 hours and 36 hours, preferably between 15 hours and 30 hours and is optimally 24 hours.

Step c) of the Method

At the end of step b) of the method, a polycrystalline block of $Cd_{1-x}Zn_xTe$ is obtained having the desired stoichiometry between the elements Cd, Zn and Te.

In addition, the polycrystalline blocks obtained at the end of step b) of the methods are free of pores, also called "microcavities", which could be found in single crystals after re-crystallization and which would substantially affect their quality and properties.

At step c) of the method, the $Cd_{1-x}Zn_xTe$ single crystal is obtained by re-crystallizing the polycrystalline block obtained at step b).

Re-crystallization annealing operations are conducted isothermal fashion.

The partial pressure of Cd of between $4 \cdot 10^5$ and $6 \cdot 10^5$ Pa makes it possible to avoid decomposition of the material.

The temperature of step c), which lies between 1000° C. and 1060° C., is both sufficient to obtain conversion of a polycrystalline network into a single crystal network while remaining lower than the melting point of CdTe or CdZnTe.

At a temperature of less than 1000° C., the annealing time may become much too long and costly, temperature being an essential parameter for growth kinetics.

At a temperature of over 1060° C., this step would be too close to the melting point and to phase pre-transitions reported in the literature.

The duration of step c) lies between 50 and 200 hours so as to allow complete conversion of the polycrystalline network into a single crystal network.

The geometry of the chamber in which step c) of the method is performed, is not determinant for the results to be achieved. It arises from the characteristics of the method that the single crystal ingot or block is formed directly from the polycrystalline ingot or block prepared at step b), and that all that is required is that the chamber used at step c) should have a volume which is able to receive the polycrystalline block prepared at step b).

In best preferred manner, the sealed chamber is an ampoule whose inner diameter is no more than 50.8 mm (no more than 2 inches).

It has been shown in the invention that re-crystallization step c) to obtain a single crystal is not inhibited by the presence of zinc in CdTe when zinc is present in CdTe at concentrations of 20% atoms or less.

Also, it has been shown in the invention that the concentration of zinc, measured in the single crystal material after re-crystallization, is equal to the concentration of zinc in the source material. Without wishing to be bound with any theory, the applicant believes that this specific characteristic of the method of the invention indicates that the phenomenon of zinc segregation in CdZnTe, which is observed in liquid phase techniques or gaseous phase techniques of the state of the art, does not occur when implementing the method of the invention, or is significantly reduced.

The absence of the zinc segregation phenomenon in CdTe when applying the method of the invention amounts to an important technical advantage since the segregation of zinc, in particular in liquid phase crystal growth techniques, is a major technical disadvantage drastically limiting production yields of end products such as substrates and detectors.

Therefore the method for obtaining a $Cd_{1-x}Zn_xTe$ single crystal according to the invention, can also be characterized in that the source material is obtained using the following method:

a) preparing a starting source material according to one of the following methods:
   i) reaction of Cd and Te, and optionally Zn, in stoichiometric quantities, in liquid phase and at high temperature;
   ii) reaction of Cd and Te, and optionally Zn, in stoichiometric quantities in vapour phase;

b) adjustment of Cd/Te stoichiometry in the source material obtained at step a) using one of the following methods:
   iii) annealing the source material at a temperature of between 800° C. and 900° C. in an ampoule with capillary, condensing any excesses of one of elements Cd and Te;
   iv) crystallizing the source material using Bridgman's horizontal method, under partial Cd pressure (Horizontal Bridgman growth of large high quality $Cd_{1-y}Zn_yTe$ crystals, P. BRUNET, A. KATTY, D. SCHNEIDER, A. TROMSON-CARLI, R. TRIBOULET, Mater Sci. Eng. B16 (1993)44)

The $Cd_{1-x}Zn_xTe$ single crystal which forms the end product of the method of the invention is a fully single crystal, which is rarely obtained, and at all events not in reproducible manner with any of the vapour phase or liquid phase methods described in the state of the art.

In particular, the method of the invention has already made it possible to obtain single crystals with a large surface area, up to 4 cm². Single crystals of 20 cm² are currently under preparation.

For CdTe single crystals, it has been shown in the invention that these single crystals have pseudo-Kikuchi lines with up to $4^{th}$ order resolution. Pseudo-Kikuchi lines are electron-channelling patterns seen under scanning electron microscopy.

It was also shown that the CdTe single crystals obtained with the method of the invention showed rocking-curve widths at mid-height under double X-ray diffraction of less than 30 arc seconds, which demonstrates their excellent crystallographic quality.

In addition, the CdTe or CdZnTe single crystals obtained in reproducible manner with the method of the invention have a growth axis along direction (111).

This characteristic is particularly advantageous for the production of epitaxy substrates whose (111) surfaces are preferably used at industrial level.

The CdTe single crystals of the invention have polar (111) planes solely made up of telluride atoms and planes solely made up of cadmium atoms, which considerably facilitates crystal cutting operations so as to obtain crystal wafers cut along the growth axis of the ingot. The telluride planes and cadmium planes, which are the "A" and "B" faces of the crystal wafer, are perpendicular to the <111> axis.

The invention also relates to a $Cd_{1-x}Zn_xTe$ single crystal in which x lies between 0 and 0.2, characterized in that:
(i) it has pseudo-Kikuchi lines with up to $4^{th}$ order resolution,
(ii) it has mid-height rocking-curve widths of less than 30 arc seconds.

The invention also concerns the use of a $Cd_{1-x}Zn_xTe$ single crystal such as defined above as substrate for the epitaxial deposit of a layer or plurality of layers of HgCdTe.

It also pertains to the use of a $Cd_{1-x}Zn_xTe$ single crystal such as defined above for the fabrication of an X-ray detector device or gamma ray detector device.

It also concerns the use of a single crystal according to the invention for the fabrication of an electro-optical modulating device or a photoreactive device.

It also relates to the use of a single crystal such as defined above for the fabrication of a diode element or transistor element.

For the various uses of a $Cd_{1-x}Zn_xTe$ single crystal according to the invention, persons skilled in the art may advantageously refer to the work by K. Zanio (cited above).

The invention is also illustrated, without being limited to, the following examples.

EXAMPLES

Example 1

Preparation of a CdTe Single Crystal According to the Invention

A. Material And Methods

A.1 Preparation of a CdTe Starting Material

The starting material is taken from a CdTe ingot derived from Bridgman's horizontal method under controlled partial cadmium pressure to adjust stoichiometry. The partial pressure of cadmium corresponds to a cold point in the chamber of 780° C. This experimental protocol is described in the following article: Horizontal Bridgman Growth of Large High Quality $Cd_{1-y}Zn_yTe$ Crystals, P. BRUNET, A. KATTY, D. SCHNEIDER, A. TROMSON-CARLI, R. TRIBOULET, Mater. Sci. Eng. B16 (1993)44.

Alternately the starting material may be prepared using Bridgman's vertical method with or without partial cadmium pressure control, then annealed at 900° C. in a capillary ampoule whose end is maintained at ambient temperature to adjust the composition to a value corresponding to congruent sublimation.

A-2 Preparation of a Polycrystalline Block of CdTe

The starting material, typically 60 g CdTe, is loaded into an ampoule with an inner diameter of 2 cm, subsequently sealed under a secondary vacuum. The ampoule, graphited at its two ends, is placed in a reactor with eight heating zones enabling a thermal profile to be obtained when desired so that the feed is at 950° C. and the cold point, 12 cm away from the feed, at 920° C. Thermal oscillation of a magnitude of 10° C. is set up using Eurotherm 906P regulators/programmers at the growth interface. The period of this oscillation is approximately 20 minutes. The tube is held fixed in this reactor for 24 h, a sufficient period for the entirety of the source material to be transported to the cold point.

A-3 Obtaining a CdTe Single Crystal

After removing the above-mentioned ampoule, an operation readily performed due to the presence of graphite on the ampoule walls, the polycrystalline ingot is placed in an ampoule that is also graphited. This ampoule, after sealing in a secondary vacuum, is placed in the isothermal part of a horizontal furnace at 1060° C. The ampoule also contains a quantity of cadmium corresponding to a partial pressure of $5 \times 10^5$ Pa at 1060° C. for the volume under consideration. This quantity of cadmium is determined taking into account the perfect gas equation, PV=nRT. The ampoule is maintained at this isothermal phase for 120 h.

B. Results

Analysis of the Characteristics of the Single Crystal Obtained.

The entirety of the ingot subjected to re-crystallization proves to be a single crystal. A rocking-curve width at midheight, under dual X-ray diffraction, of 30 arc seconds and pseudo-Kikuchi lines in electron channelling under scanning electron microscopy, demonstrate its excellent crystallographic quality. In addition, the source material obtained after sublimation step b) has a texture, as analysed under electron back scattering diffraction (EBSD), such that the general orientation of the growth axis of the crystals is close to (111) to within a few degrees.

This orientation is maintained in the crystals obtained after re-crystallization step c). The large face of the crystals obtained is therefore the (111) plane, which is highly favourable when cutting CdHgTe epitaxy substrates for which this is precisely the required orientation.

FIG 1. is a photograph of a single crystal obtained according to example 1. On this photograph, one can see that the final product of the process of the invention is a structure which is exclusively a single crystal, in which polycrystalline crystals are absent. More particularly, the uniform aspect of the surface of the section of the crystalline block, shown in FIG. 1, demonstrates the absence of grain boundaries, and therefore the absence of polycrystalline structures. Furthermore, the scale graduated in millimeters, at the lower part of FIG. 1 shows that the surface of the final product, which is a single crystal obtained by the process of the claimed process, is about 4 cm 2 (2 cm ×2 cm).

Figure 2:
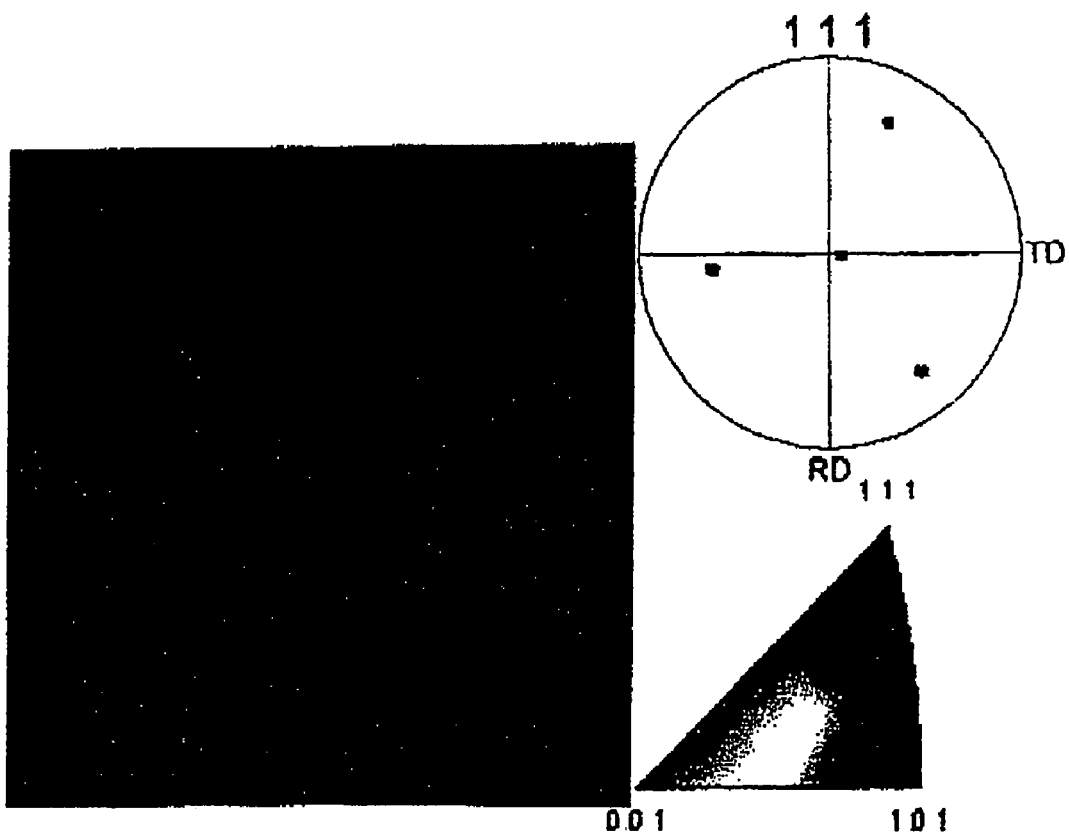
FIG. 2 shows the results of a retro-diffused-electron-diffraction test.

FIG. 2 represents the results of a test of retro-diffusedelectron diffraction (EBSD). One can see from FIG. 2 that the crystalline block obtained by the process of the invention is exclusively a single crystal. Indeed, the EBSD analysis is realised by scanning a beam of electrons on all the surface of the crystal according to the invention. The uniform blue colour demonstrates that the general orientation of the growing axis of the crystals is closed to the axis (111) and that the crystalline block is exempt of grain boundaries.

The invention claimed is:

1. A method for obtaining a $Cd_{1-x}Zn_xTe$ single crystal, in which x is a value from 0 to 0.2, which comprises the following steps:
    a) obtaining a source material of $Cd_{1-x}Zn_xTe$ having a composition close to that corresponding to congruent sublimation, either by crystallization of liquid $Cd_{1-x}Zn_xTe$ using Bridgman's horizontal technique under partial cadmium pressure to adjust stoichiometry, or by annealing a $Cd_{1-x}Zn_xTe$ material pre-synthesized at 800-900° C. in an ampoule with end capillary maintained at ambient temperature,
    b) obtaining a polycrystalline block of $Cd_{1-x}Zn_xTe$ in which x lies between 0 and 0.2 by sublimation of a stoichiometric solid source material of $Cd_{1-x}Zn_xTe$ in a sealed chamber at a temperature of the chamber zone in which the source material is located at between 900° C. and 1000° C., the difference in temperature ΔT between the zone of the source material and the zone of crystal deposit lying between 30° and 50° C.
    c) obtaining a $Cd_{1-x}Zn_xTe$ single crystal by re-crystallizing the polycrystalline block obtaining at step b), by annealing under isothermal conditions under partial Cd pressure of between $4\cdot10^5$ and $6\cdot10^5$ Pa and at a temperature of between 1000° C. and 1060° C. for a time of between 50 and 200 hours.

2. A method as in claim 1, wherein the $Cd_{1-x}Zn_xTe$ single crystal is a CdTe single crystal when x=0.

3. A method as in claim 1, step b) of which the temperature of the source material zone lies between 940° C. and 960° C.

4. A method as in claim 1, in step b) of which the distance between the evaporation surface of the source material feed and the deposit zone lies between 10 and 20 cm.

5. A method as in claim 1, in step b) of which the condensation surface is subjected to a sinusoidal temperature fluctuation of a magnitude in the order of 10° C. and whose period is approximately 20 minutes.

6. A method as in claim 1 wherein the source material is obtained by the following method:
   a) preparing a starting source material according to one of the following methods:
      i) reaction of Cd and Te, and optionally Zn, in stoichiometric quantities, in liquid phase and at high temperature;
      ii) reaction of Cd and Te, and optionally Zn, in stoichiometric quantities, in vapour phase;
   b) adjustment of Cd/Te stoichiometry in the source material obtained at step a) using one of the following methods:
      iii) annealing the source material at a temperature of between 800° C. and 900° C. in an ampoule with capillary, condensing any excesses of one of elements Cd and Te;
      iv) crystallizing the starting source material using Bridgman's horizontal method, under partial Cd pressure to permit stoichiometry adjustment.

7. A method as in claim 3 wherein the temperature of the source material zone is between 945° and 955°0 C.

8. A method as in claim 7 wherein the temperature of the source material zone is approximately 950°.

9. A method as in claim 4 wherein the distance between the evaporation surface of the source material feed and the deposit zone lies between 12 and 15 cm.

* * * * *